United States Patent [19]
Schucker et al.

[11] Patent Number: 5,461,575
[45] Date of Patent: Oct. 24, 1995

[54] SIMULATION OF SEQUENTIAL CIRCUITS FOR CALCULATING TIMING CHARACTERISTICS TO DESIGN/MANUFACTURE A LOGIC NETWORK

[75] Inventors: Douglas W. Schucker, Mesa; Greg Djaja; Lee Mah, both of Tempe, all of Ariz.

[73] Assignee: Motorola, Inc., Schaumburg, Ill.

[21] Appl. No.: 203,128

[22] Filed: Feb. 28, 1994

Related U.S. Application Data

[63] Continuation-in-part of Ser. No. 692,406, Apr. 26, 1991, abandoned.

[51] Int. Cl.[6] ............................................. G06F 17/50
[52] U.S. Cl. ..................... 364/489; 364/578; 364/569
[58] Field of Search .................................... 364/488, 489, 364/578, 579, 490, 569; 395/500

[56] References Cited

U.S. PATENT DOCUMENTS

| | | | |
|---|---|---|---|
| 4,205,301 | 5/1980 | Hisazawa | 371/3 |
| 4,644,487 | 2/1987 | Smith | 364/578 |
| 4,744,084 | 5/1988 | Beck et al. | 364/578 |
| 4,754,215 | 6/1988 | Kawai | 324/73 R |
| 4,815,024 | 3/1989 | Lewis | 364/578 |
| 4,827,428 | 5/1989 | Dunlop et al. | 364/491 |
| 4,924,430 | 5/1990 | Zasio et al. | 364/578 |
| 4,937,765 | 6/1990 | Shupe et al. | 364/570 |
| 4,937,827 | 6/1990 | Beck et al. | 364/578 |
| 5,047,971 | 9/1991 | Horwitz | 364/578 |
| 5,095,454 | 3/1992 | Huang | 364/578 |
| 5,105,374 | 4/1992 | Yoshida | 364/578 |
| 5,191,541 | 3/1993 | Landman et al. | 364/578 |
| 5,210,700 | 5/1993 | Tom | 364/578 |
| 5,278,769 | 1/1994 | Bair et al. | 364/488 |

OTHER PUBLICATIONS

V. R. Mokkarala, "A Unified Approach to Simulation and Timing Verification at the Functional Level," IEEE 22nd Design Automation Conference, 1985, pp. 757–761.

*Primary Examiner*—Emanuel T. Voeltz
*Assistant Examiner*—Kyle J. Choi
*Attorney, Agent, or Firm*—Rennie William Dover; Lee Mah

[57] ABSTRACT

A method for obtaining characterization of timing parameters of a sequential circuit includes inputting predetermined data sequences to the sequential circuit. The sequential circuit is then simulated in response to the predetermined data sequences, and signals appearing at internal nodes of the sequential circuit are observed with respect to time. A plurality of timing parameters of the sequential circuit can then be calculated by using the values of the signals at the internal nodes.

14 Claims, 3 Drawing Sheets

SIMULATION OF SEQUENTIAL CIRCUITS FOR CALCULATING TIMING CHARACTERISTICS TO DESIGN/MANUFACTURE A LOGIC NETWORK

This application is a continuation-in-part of prior application Ser. No. 07/692,406, filed Apr. 26, 1991, now abandoned.

BACKGROUND OF THE INVENTION

This invention relates to integrated circuits, such as to the characterization of sequential circuits.

Application specific integrated circuits (ASIC) typically rely on the use of logic simulation to verify functionality, performance and timing accuracy of the ASIC. As a result, accurate timing data must be generated for each macrocell to be inserted into the logic simulation models. For flip flops and latches, typical timing parameters include:

1) setup time;
2) hold time;
3) minimum clock pulse width;
4) minimum reset pulse width; and
5) minimum reset recovery time.

When verifying only a few macrocells, timing parameters are typically obtained by trial and error techniques using a circuit simulator. For example, a plurality of input stimuli is input to the macrocells until a desired output result appears at the output of the macrocells. However, when a macrocell library contains a large number of macrocells and many libraries have to be developed for a new ASIC, trial and error techniques consume an enormous amount of time and computer resources.

Hence, a need exists for an improved method to obtain parameter characterizations of sequential circuits thereby avoiding time consuming trial and error techniques.

SUMMARY OF THE INVENTION

Briefly, there is provided a method for characterizing a sequential circuit having at least one input terminal and at least one output terminal, the method comprising the steps of (a) simulating the sequential circuit using simulated input signals; (b) observing simulated signals at one or more internal nodes of the sequential circuit in response to step (a); (c) obtaining timing parameters of the sequential circuit by using the simulated signals; and (d) inserting the timing parameters into respective software models for the sequential circuit; (e) using the sequential circuit to design a logic network; (f) simulating the performance of the logic network using a logic simulator; (g) obtaining timing performance of the logic network from the result of step (f); and using the obtained timing performance to manufacture a logic network such that the manufacture of the logic network as an integrated circuit may proceed with the assurance that the logic network will perform according to the timing performance from the logic simulation.

DETAILED DESCRIPTION OF THE INVENTION

Figure 1:
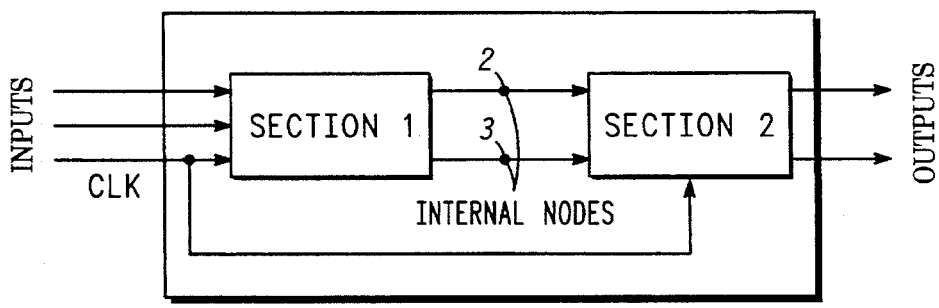
FIG. 1 is a block diagram illustrating a generic sequential circuit in accordance with the present invention.

Referring to FIG. 1, a block diagram illustrating generic sequential circuit 1 is shown comprising section 1 and section 2. Sequential circuit 1 has a plurality of inputs (INPUTS), one of which is signal CLK, and provides a plurality of outputs (OUTPUTS). Section 1 is responsive to the plurality of inputs which supplies a predetermined logic sequence thereto. Section 1 provides a first predetermined operation such as a master section of a master-slave flip flop. Section 1 also provides a plurality of outputs to section 2. Further, internal nodes 2 and 3 are shown between sections 1 and 2. Section 2 is responsive to the plurality of outputs of section 1 and signal CLK for performing a second predetermined operation and for providing the plurality of outputs of sequential circuit 1. As an example, section 2 may be a slave section of a master-slave flip flop.

The present invention defines a method to obtain characterization of timing parameters of a sequential circuit by observing its internal nodes.

Figure 2:
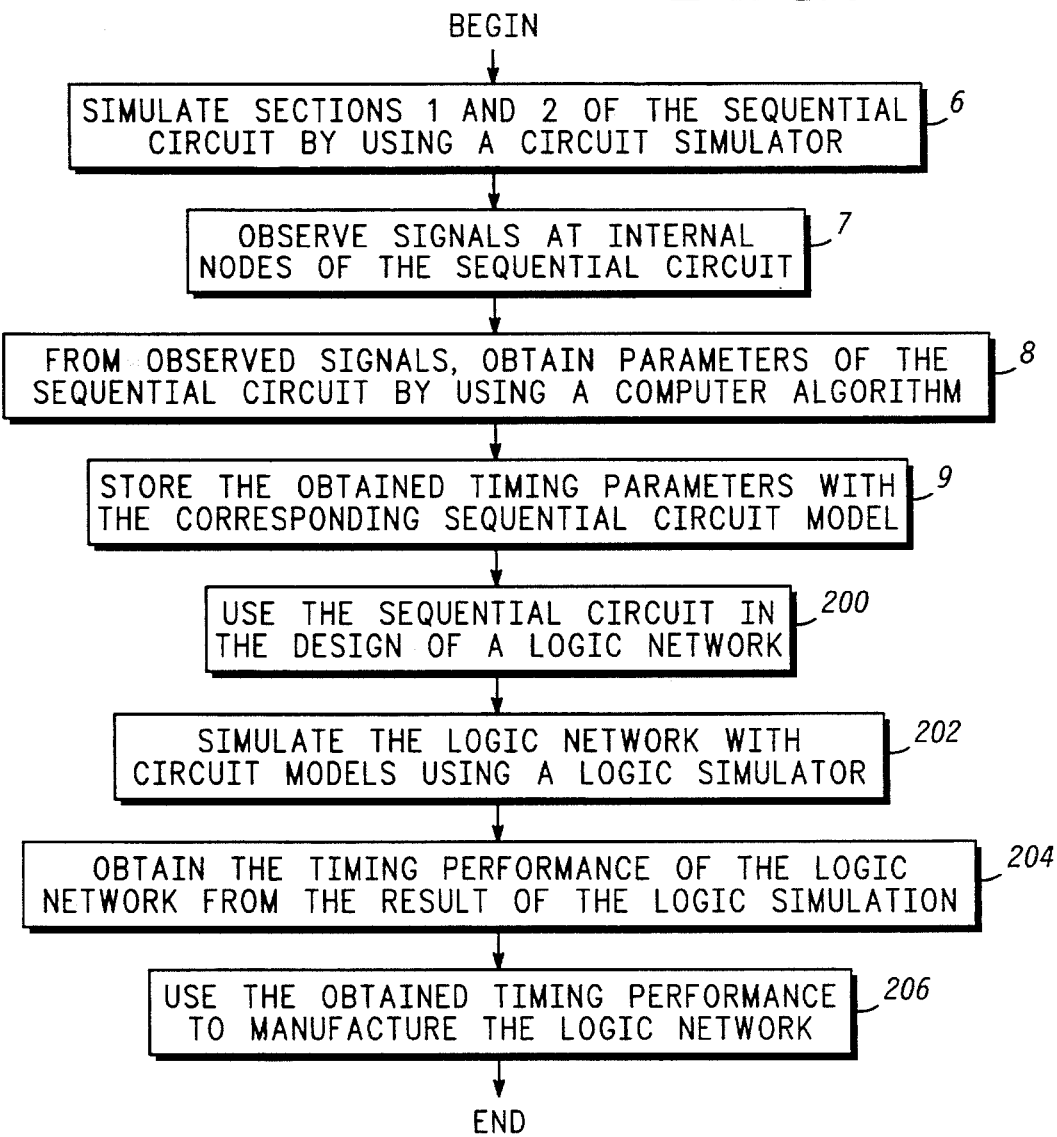
FIG. 2 is a flow chart illustrating a method to obtain parameters of a sequential circuit in accordance with the present invention.

Referring to FIG. 2, a flowchart illustrating the method of obtaining timing parameters of a general sequential circuit is shown. The sequential circuit is simulated by using a circuit simulator via a computer as illustrated by box 6. A circuit simulator such as SPICE or any other suitable nodal analysis program can be utilized. For example, sections 1 and 2 of sequential circuit 1 are simulated by using SPICE.

Next in box 7, the simulated signals appearing at internal nodes of the sequential circuit are observed. For example, the signals appearing at internal nodes 2 and 3 of FIG. 1 are observed in response to the simulated input logic sequence (INPUTS). Although internal nodes 2 and 3 are shown coupled between sections 1 and 2, it is understood that other internal nodes within section 1 or section 2 could also be observed.

From the observed signals, parameters of the sequential circuit are calculated by using a computer algorithm as illustrated by box 8. Typical parameters calculated may include setup time, hold time and minimum clock pulse width. Further, these parameters are calculated by equations which are easily implemented in a software program in conjunction with the circuit simulator. It is also worth noting that both the simulation of the sequential circuit and the calculation of the timing parameters for the sequential circuit can be controlled and automated by a computer which is responsive to a computer program. Thus, in this scenario, a simulated logic sequence is input to a sequential circuit that is simulated, and various timing parameters associated with the sequential circuit are generated. The timing parameters obtained for each sequential circuit simulated is stored in a computer data base with its corresponding sequential circuit software model as illustrated in box 9. Thus, now the full software model of the sequential circuit includes timing parameters as well as the physical configuration.

The software models of various sequential circuits (like the one created in box 9) can then be utilized to design a logic network wherein a software representation of the logic network is constructed using the software models of various sequential circuits as illustrated in box 200. As a result, since the timing parameters for each sequential circuit is inserted into the corresponding software model of the sequential circuit, an accurate timing analysis of the logic network can be simulated.

The simulation of the logic network is then performed with a logic simulator as illustrated in box 202. A logic simulator such as Verilog-XL from Cadence Design Systems Inc., or any of a number of commercially available logic simulators may be utilized.

The result of the logic simulation includes the timing performance of the logic network as illustrated in box 204. When the timing performance of the logic network has been obtained, the manufacture of the logic network as an integrated circuit, as illustrated in box 206, may proceed with the assurance that the logic network will perform according to the timing performance from the logic simulation.

Figure 3:
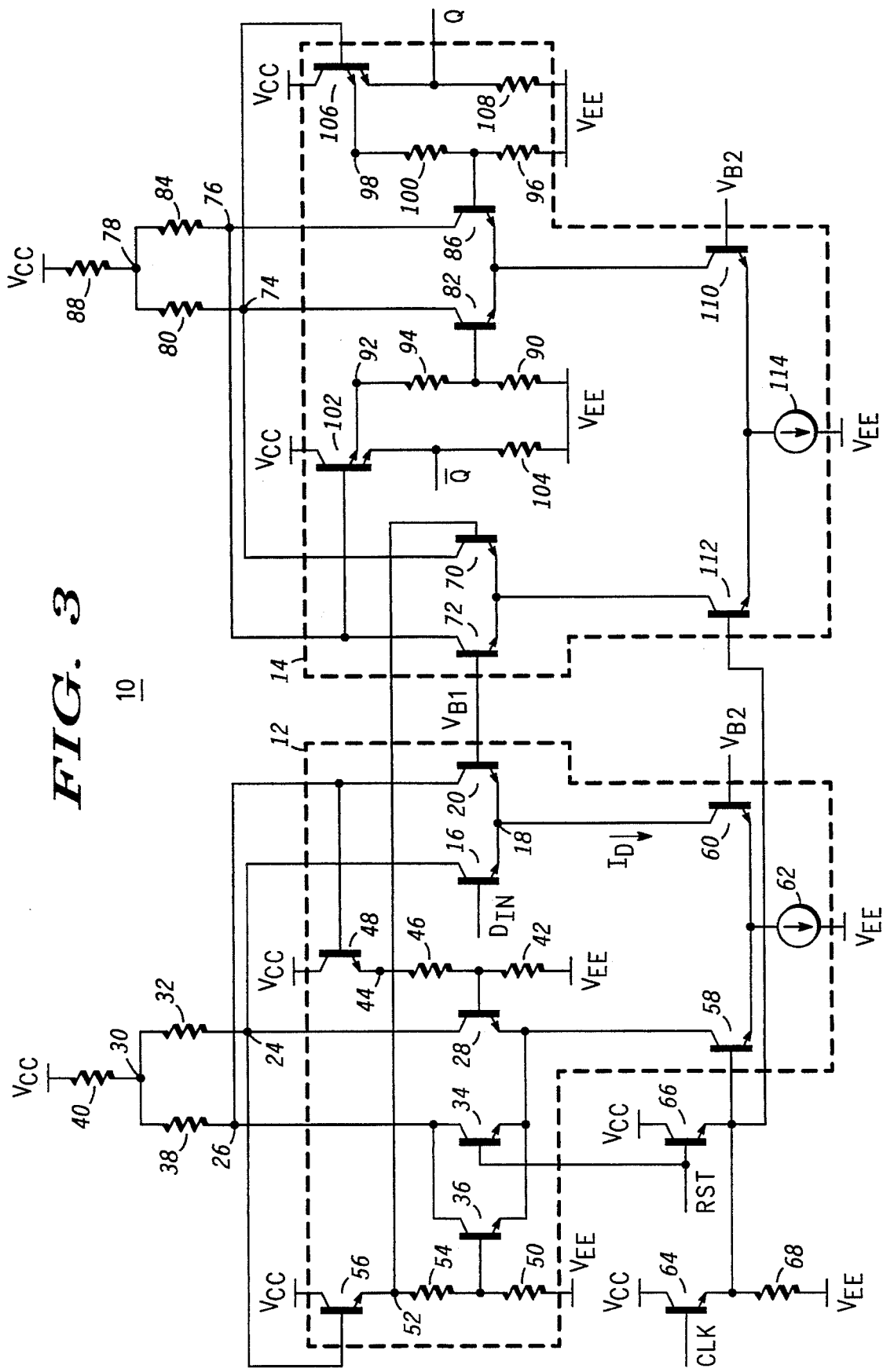
FIG. 3 is a detailed schematic diagram illustrating a master-slave flip flop sequential circuit.

Referring to FIG. 3, a detailed schematic illustrating master-slave flip flop 10 is shown comprising master section 12 and slave section 14. Master section 12 includes transistor 16 having a base to which signal $D_{IN}$ is applied and an emitter coupled to circuit node 18. Circuit node 18 is also coupled to the emitter of transistor 20. Transistors 16 and 20 form the master input transistor pair. The base of transistor 20 is coupled to receive bias potential $V_{B1}$. The collectors of transistors 16 and 20 are respectively coupled to circuit nodes 24 and 26. Circuit node 24 is coupled to the collector of transistor 28 and to circuit node 30 via resistor 32. Circuit node 26 is coupled to the collectors of transistors 34 and 36 and to circuit node 30 via resistor 38. Transistors 28 and 34 form the master storage transistor pair. Circuit node 30 is coupled to operating potential $V_{CC}$ by resistor 40. The base of transistor 28 is coupled to operating potential $V_{EE}$ via resistor 42. The base of transistor 28 is also coupled via resistor 46 to circuit node 44 which is coupled to the emitter of transistor 48. The base of transistor 48 is coupled to circuit node 26, and the collector of transistor 48 is coupled to operating potential $V_{CC}$. Likewise, the base of transistor 36 is coupled to operating potential $V_{EE}$ via resistor 50. Also, the base of transistor 36 is coupled via resistor 54 to circuit node 52 which is coupled to the emitter of transistor 56. The base of transistor 56 is coupled to circuit node 24, and the collector of transistor 56 is coupled to operating potential $V_{CC}$. The emitters of transistors 28, 34 and 36 are all coupled to the collector of transistor 58, and the emitters of transistors 16 and 20 are coupled to the collector of transistor 60. The emitters of transistors 58 and 60 are coupled to operating potential $V_{EE}$ by current source 62. The base of transistor 60 is coupled to receive bias potential $V_{B2}$ while the base of transistor 58 is coupled to the emitters of transistors 64 and 66. The base of transistor 64 is coupled to receive signal CLK while the base of transistor 66 is coupled to receive signal RST and to the base of transistor 34. The collectors of transistors 64 and 66 are coupled to operating potential $V_{CC}$. The emitter of transistor 64 is further coupled to operating potential $V_{EE}$ via resistor 68.

Slave section 14 includes transistor 70 having a base coupled to circuit node 52 of master section 12 and an emitter coupled to the emitter of transistor 72. Transistors 70 and 72 form the slave input transistor pair. The base of transistor 72 is coupled to receive bias potential $V_{B1}$. The collectors of transistors 70 and 72 are respectively coupled to circuit nodes 74 and 76. Circuit node 74 is coupled to circuit node 78 via resistor 80 and to the collector of transistor 82. Likewise, circuit node 76 is coupled to circuit node 78 via resistor 84 and to the collector of transistor 86. Transistors 82 and 86 form the slave storage transistor pair.

Circuit node 78 is coupled to operating potential $V_{CC}$ via resistor 88. The base of transistor 82 is coupled to operating potential $V_{EE}$ via resistor 90 and to circuit node 92 via resistor 94. Likewise, the base of transistor 86 is coupled to operating potential $V_{EE}$ via resistor 96 and to circuit node 98 via resistor 100. Transistor 102 has a base coupled to circuit node 76 and a collector coupled to operating potential $V_{CC}$. A first emitter of transistor 102 is coupled to circuit node 92, and a second emitter of transistor 102 is coupled to operating potential $V_{EE}$ via resistor 104. Also, the second emitter of transistor 102 is coupled for providing signal $\bar{Q}$ of flip flop 10.

Transistor 106 has a base coupled to circuit node 74 and a collector coupled to operating potential $V_{CC}$. A first emitter of transistor 106 is coupled to circuit node 98, while a second emitter of transistor 106 is coupled to operating potential $V_{EE}$ via resistor 108. Also, the second emitter of transistor 106 is coupled for providing signal Q of flip flop 10.

The emitters of transistors 82 and 86 are coupled to the collector of transistor 110 while the emitters of transistors 70 and 72 are coupled to the collector of transistor 112. The emitters of transistors 110 and 112 are coupled to operating potential $V_{EE}$ through current source 114. The base of transistor 110 is coupled to receive bias potential $V_{B2}$, while the base of transistor 112 is coupled to the emitter of transistor 64.

The operation of flip flop circuit 10 of FIG. 3 is well known in the art. However, a brief discussion will be presented for completeness. In operation, input data is applied at the base of transistor 16 via signal $D_{IN}$. When signal CLK is in a logic low state, transistor 60 is rendered operative and input transistor pair 16 and 20 are enabled. This generates predetermined voltages at circuit nodes 24 and 26 corresponding to the logic level of signal $D_{IN}$. For example, if signal $D_{IN}$ is a logic low, then a voltage level indicative of a logic low voltage will appear at circuit node 26 and a voltage level indicative of a logic high voltage will appear at circuit node 24. The voltage level appearing at circuit node 52 is substantially one base-emitter voltage drop below the voltage at circuit node 24. Further, the voltage appearing at circuit node 52 is supplied to the base of transistor 70 of slave section 14 wherein transistor pair 70 and 72 are presently disabled since transistor 112 is rendered non-operative. For signal $D_{IN}$ being a logic low, the voltage level appearing at the base of transistor 70 is indicative of a logic high voltage level. Further, it is understood that the voltage applied to the base of transistor 70 can change without affecting the output of flip flop 10. However, transistor 110 is rendered operative thereby enabling storage transistor pair 82 and 86. Thus, transistors 82 and 86 respectively hold (or latch) the present logic voltages appearing at circuit nodes 74 and 76 and, thus, respectively maintain the voltage levels of signals Q and $\bar{Q}$.

On the other hand, when signal CLK switches to a logic high state, transistor 58 is rendered operative and the voltage levels appearing at nodes 24 and 26 are maintained by storage transistor pair 28 and 34. Further, the voltage level appearing at the base of transistor 70 is also maintained by storage transistor pair 28 and 34 via transistor 56. Transistor 60 is rendered non-operative thereby disabling transistors 16 and 20 and, thus, signal $D_{IN}$ can change logic levels without affecting the output of flip flop 10. Transistor 112 is rendered operative thereby enabling transistor pair 70 and 72. This generates predetermined voltages at circuit nodes 74 and 76 corresponding to the logic level appearing at the base of transistor 70. For the aforementioned example, if signal $D_{IN}$ is a logic low, then a logic high voltage level will appear at the base of transistor 70 thereby providing a logic low voltage at circuit node 74 and a logic high voltage level at circuit node 76. Further, the logic voltage levels appearing at circuit nodes 74 and 76 respectively appear at signals Q and $\bar{Q}$ via transistors 106 and 102, respectively. It is understood that when signal CLK switches to a logic low state again, the voltage levels appearing on signals Q and $\bar{Q}$ are latched by enabling storage pair transistor 82 and 86 as aforedescribed.

In addition, if signal RST (reset) is a logic high, signals Q and $\bar{Q}$ are respectively placed at a logic low and high logic state. In particular, if signal RST is a logic high, transistors 58 and 112 are rendered operative thereby respectively enabling transistor pair 28 and 34 and transistor pair 70 and 72. Further, a logic high voltage is applied to the base of transistor 34 which generates high and low voltage levels respectively at circuit nodes 24 and 26 and provides a logic high voltage level at the base of transistor 70. Since transistor pair 70 and 72 are enabled, logic low and high voltage levels are respectively generated at circuit nodes 74 and 76 corresponding to the logic high voltage level applied to the base of transistor 70. Further, the logic low voltage level at circuit node 74 provides a logic low voltage level on signal Q via transistor 106 while the logic high voltage level at circuit node 76 provides a logic high voltage level on signal $\bar{Q}$ via transistor 102. Thus, when signal RST is a logic high, signals Q and $\bar{Q}$ are respectively logic low and high voltage levels.

The present invention provides a method to obtain characterization of timing parameters of a sequential circuit. As one implementation of the method, the present invention is utilized to measure the set-up time of flip flop 10. In general, set-up time can be defined as the time required to latch data into the master storage transistor pair before the clock signal disables the master input transistor pair. In particular, the set-up time ($T_{set-up}$) for flip flop 10 can be expressed as the delay of signal $D_{IN}$ from the base of transistor 16 to circuit node 52 less the clock delay for turning off the master input transistor pair (transistors 16 and 20). Therefore, set-up time for logic high data appearing at the base of transistor 16 can be expressed as the time from the 50% low-high transition of signal $D_{IN}$ to the 50% high-low transition of the signal at circuit node 52 less the time from the 50% low-high transition of signal CLK to the 75% high-low transition of current $I_D$. The 75% point of current $I_D$ is chosen since at 75% of the nominal value of current $I_D$, transistors 16 and 20 are still enabled enough to provide sufficient voltage levels at circuit nodes 24 and 26.

Figure 4:
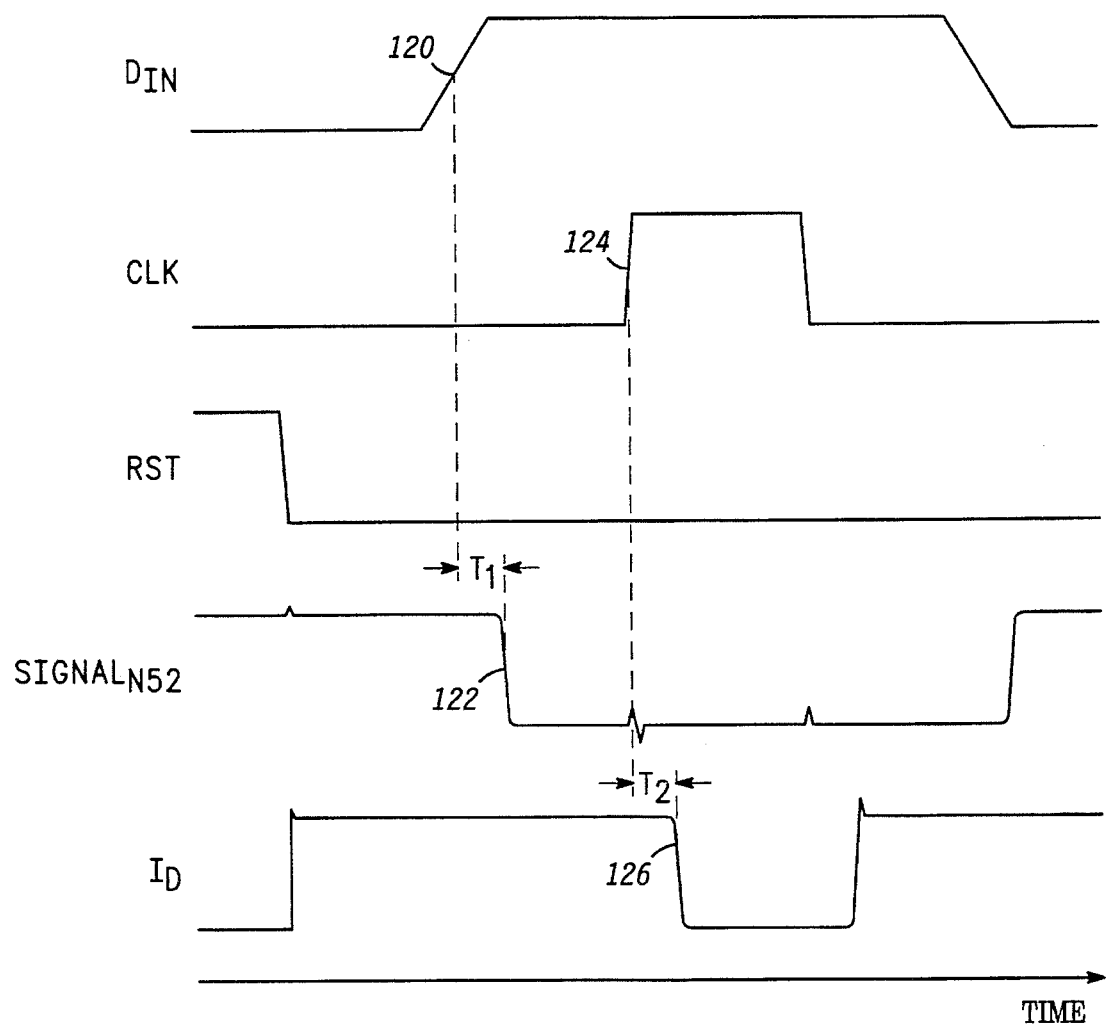
FIG. 4 is a timing diagram illustrating timing relationships between various nodes of the master-slave flip flop sequential circuit of FIG. 3.

Referring to FIG. 4, a timing diagram illustrating timing relationships between selected circuit nodes of flip flop circuit 10 of FIG. 3 is shown. Time point 120 illustrates the 50% low-high transition point for signal $D_{IN}$, while time point 122 illustrates the 50% high-low transition point for the signal occurring at circuit node 52 ($SIGNAL_{N52}$). Thus, time $T_1$ represents the time from point 120 to point 122. In a similar manner, time point 124 illustrates the 50% low-high transition point for signal CLK, while time point 126 illustrates the 75% high-low transition point for current $I_D$. Thus, time $T_2$ represents the time from point 124 to point 126. It is understood that time points 120, 122, 124 and 126 can be obtained by a simulation of flip flop circuit 10. Times $T_1$ and $T_2$ can be calculated and the set-up time for flip flop 10 can then be expressed in equation form as the difference between times $T_1$ and $T_2$ ($T_{set-up} = T_1 - T_2$). In summary, by observing the voltage level at internal circuit node 52 and the current level at internal circuit node 18 (the common emitters of transistors 16 and 20), the set-up time of flip flop 10 can be obtained. Further, time measurements $T_1$ and $T_2$ need to be generated only once for the set-up time to be calculated. In addition, the logic transitions occurring at signals Q and $\bar{Q}$ are of secondary concern and do not need to be monitored for transitions. Thus, the present invention provides a substantial improvement over the prior art since trial and error techniques of monitoring output signals Q and $\bar{Q}$ are abated.

It is worth noting that in a similar manner to measuring the set-up time for logic high data, the set-up time for logic low data can also be measured. Thus, the set-up time for logic low data appearing at the base of transistor 16 can be expressed as the time from the 50% high-low transition of signal $D_{IN}$ to the 50% low-high transition of the signal at node 52 less the time from the 50% low-high transition of signal CLK to the 75% high-low transition of current $I_D$. Once the set-up time (as well as other timing parameters for flip-flop circuit 10) is obtained, it is stored with a software model representing the configuration of flip flop circuit 10. It is now this software model that includes timing parameters that is now used to design a logic network as aforedescribed. Thus, when a logic simulator simulates the operation of the logic network, an accurate timing performance of the logic network is obtained and the manufacture of the logic network as an integrated circuit may proceed with the assurance that the logic network will perform according to the timing parameters from the logic simulation.

The present invention has been illustrated by measuring the set-up time for a flip flop circuit. However, the present invention could also have been illustrated by measuring other parameters such as hold time, minimum clock pulse width, minimum reset pulse width or minimum recovery time.

By now it should be apparent from the foregoing discussion that a novel method for obtaining characterization of timing parameters of a sequential circuit has been provided.

The present invention has provided a method for obtaining timing parameters of sequential circuits and utilizing these timing parameters to provide an accurate software timing model of the sequential circuits. These software timing models are then used to design a logic network which is then simulated via a logic simulator, the results of which are used to manufacture the logic network with known timing performance.

What is claimed is:

1. A computer method for obtaining timing parameters for a sequential circuit to design a logic circuit, the sequential circuit having at least one input terminal and at least one output terminal, the method comprising the steps of:

(a) simulating the operation of the sequential circuit in response to a simulated input signal and generating internal simulated signals;

(b) observing said internal simulated signals at one or more internal nodes of the sequential circuit in response to step (a);

(c) measuring a time difference of said simulated signals appearing at one or more internal nodes with respect to said simulated input signal;

(d) using said measured time differences of step (c) to obtain the timing parameters of the sequential circuit; and (e) using the timing parameters of the sequential circuit to manufacture a logic network.

2. The method according to claim 1 wherein step (d) is performed by a computer algorithm.

3. The method according to claim 1 wherein the sequential circuit is a flip flop circuit.

4. The method according to claim 1 wherein in step (e) the parameters are calculated with respect to time.

5. The method according to claim 1 wherein steps (a) through (d) are controlled by a computer.

6. The method according to claim 1 further including, after step (d), the step of storing the timing parameters of the sequential circuit with its corresponding software model to create an accurate timing model of the sequential circuit.

7. The method according to claim 6 further including the step of using said timing model of the sequential circuit to design a logic network.

8. The method according to claim 7 further including the step of simulating said logic network using a logic simulator.

9. The method according to claim 8 further including the step of obtaining a timing performance of said logic network from the results of said step of simulating said logic network.

10. A computer method for measuring the set-up time of a flip flop circuit to design a logic circuit, the flip flop circuit having at a data input terminal, a clock input terminal and at least one output terminal, the method comprising the steps of:

(a) simulating the operation of the flip flop circuit in response to simulated input signals and generating simulated internal signals;

(b) observing said simulated internal signals at first and second internal nodes of the flip flop circuit;

(c) measuring time differences of said simulated internal signals with respect to said simulated input signals occurring at the data and clock input terminals;

(d) using said simulated internal signals and said simulated input signals to obtain the set-up time of the flip flop circuit; and (e) using the set-up time of the flip flop circuit to manufacture a logic network.

11. The method according to claim 10 further including, after step (d), the step of storing the timing parameters of the flip flop circuit with its corresponding software model to create an accurate timing model of the flip flop circuit.

12. The method according to claim 11 further including the step of using said timing model of the flip flop circuit to design a logic network.

13. The method according to claim 12 further including the step of simulating said logic network using a logic simulator.

14. The method according to claim 13 further including the step of obtaining a timing performance of said logic network from the results of said step of simulating said logic network.

* * * * *